United States Patent
Itokawa et al.

(10) Patent No.: US 7,557,040 B2
(45) Date of Patent: Jul. 7, 2009

(54) METHOD OF MANUFACTURE OF SEMICONDUCTOR DEVICE

(75) Inventors: Hiroshi Itokawa, Yokohama (JP); Yoshimasa Kawase, Yokohama (JP); Toshihiko Iinuma, Yokohama (JP); Haruko Akutsu, Yokosuka (JP); Kyoichi Suguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 223 days.

(21) Appl. No.: 11/644,887

(22) Filed: Dec. 26, 2006

(65) Prior Publication Data

US 2007/0166977 A1  Jul. 19, 2007

(30) Foreign Application Priority Data

Dec. 26, 2005  (JP) .............................. 2005-373034

(51) Int. Cl.
*H01L 21/44* (2006.01)

(52) U.S. Cl. ...................................... 438/682; 438/655

(58) Field of Classification Search ................. 438/630, 438/649, 651, 655, 682, 683, 685, 686; 257/754, 257/757, 766

See application file for complete search history.

(56) References Cited

U.S. PATENT DOCUMENTS

| | | | | |
|---|---|---|---|---|
| 5,162,263 | A | * | 11/1992 | Kunishima et al. .......... 438/535 |
| 6,632,740 | B1 | * | 10/2003 | Bertrand et al. ............. 438/682 |
| 6,806,172 | B1 | | 10/2004 | Woo et al. |
| 2005/0158996 | A1 | * | 7/2005 | Kim et al. .................... 438/664 |
| 2005/0189652 | A1 | * | 9/2005 | Nakatsuka et al. .......... 257/757 |
| 2006/0130746 | A1 | * | 6/2006 | Terashima et al. ............ 117/95 |
| 2008/0227283 | A1 | * | 9/2008 | Cabral et al. ................ 438/602 |

FOREIGN PATENT DOCUMENTS

JP  2005-019705  1/2005

* cited by examiner

*Primary Examiner*—Kevin M Picardat
(74) *Attorney, Agent, or Firm*—Finnegan, Henderson, Farabow, Garrett & Dunner, L.L.P.

(57) ABSTRACT

A semiconductor device manufacturing method is disclosed. A silicon-containing gate electrode is first formed above the surface of a silicon-containing semiconductor substrate. Then, a sidewall insulating film is formed on the sidewall of the gate electrode and a film of metal is formed on the semiconductor substrate to cover the gate electrode and the sidewall insulating film. The front and back sides of the semiconductor substrate are heated through heat conduction by an ambient gas. Thereby, the metal is caused to react with silicon contained in the semiconductor substrate and the gate electrode to form a metal silicide film.

15 Claims, 7 Drawing Sheets

Comparative Example
FIG. 8

Comparative Example
FIG. 9

Comparative Example

F I G. 10

F I G. 11

F I G. 12

| Thermal anneal | FWHM of X-ray diffraction peak |
|---|---|
| Comparative Example | 7.34° |
| Embodiment | 2.34° |

METHOD OF MANUFACTURE OF SEMICONDUCTOR DEVICE

CROSS-REFERENCE TO RELATED APPLICATIONS

This application is based upon and claims the benefit of priority from prior Japanese Patent Application No. 2005-373034, filed Dec. 26, 2005, the entire contents of which are incorporated herein by reference.

BACKGROUND OF THE INVENTION

1. Field of the Invention

The invention relates to a method of manufacture of a semiconductor device employing silicide.

2. Description of the Related Art

As the dimensions of semiconductor devices are scaled down, fine patterning on the surface of a semiconductor substrate (the dimensions of gates of transistors, the width of device isolation regions, the width of interconnect lines, etc.) is increasingly required. Further, it is required to reduce the dimensions in the direction perpendicular to the surface of the semiconductor substrate (the diffusion layers of source/drain and extension regions and the depth of junctions of the source/drain and extension regions).

However, simply trying to reduce the vertical dimensions results in problems of degradation of the performance of transistors. For example, when the resistivity of extension regions increases and consequently the parasitic resistance increases, the driving capability of transistors degrades. In order to implement shallow extension regions of low resistivity, a thermal processing method has been developed which suppresses the diffusion of impurity ions implanted at high concentration.

In addition, it is also required to reduce the parasitic resistance of source/drain regions by forming a silicide film of low resistivity on their contact regions. To form a silicide film of low resistivity, a self-aligned silicide (salicide) process is used (see, for example, U.S. Pat. No. 6,806,172).

For example, in manufacturing a metal oxide semiconductor (MOS) field effect transistor using that salicide process, a semiconductor substrate of silicon is first formed with device isolation regions of insulating layers and gate electrodes having a sidewall insulating film. Then, impurity diffusion layers of source/drain regions are formed in portions of the semiconductor substrate between the device isolation regions and the sidewall insulating film by means of ion implantation.

Next, a film of metal, such as Ni, is deposited onto the surface of the semiconductor substrate formed with the impurity diffusion layers. A film of metal silicide, such as nickel silicide (NiSi), is then formed on the surface of the polysilicon gate electrodes and the surface of the impurity diffusion layers by means of rapid thermal annealing (RTA) using a halogen lamp or furnace annealing using an electric furnace. Unreacted metal film on the insulating film on the device isolation regions and the sidewall insulating film is removed. Thus, a MOSFET is manufactured.

As the dimensions of devices are scaled down, the pn junctions of the source/drain regions become shallower. For this reason, the distance between the bottom of the metal silicide film formed on the surface of the impurity diffusion layer and the pn junction of the impurity diffusion layer is reduced. A problem arises in that the frequency of occurrence of a failure of junction leakage increases because an electric field concentrates at protruding portions of the bottom of the metal silicide film and the metal for silicide formation is made easy to diffuse to the pn junction by a thermal process after silicidation.

The RTA is larger in the rate of temperature elevation than the furnace annealing and hence allows heating to be carried out in a shorter time. Thus, the RTA allows a thin film of metal silicide to be formed with the diffusion of metal suppressed.

However, the RTA for silicide formation causes the metal film deposited on the insulating film on the device isolation regions and the sidewall insulating film of the gate electrode to aggregate and flow into the source/drain regions and the gate electrode. As a result, the thickness of the metal silicide film at the edges of the source/drain regions and the edges of the gate electrode increases above a design value, which leads to increased junction leakage.

BRIEF SUMMARY OF THE INVENTION

According to an aspect of the invention, there is provided a method of manufacture of a semiconductor device comprising the steps of: forming a gate electrode containing silicon above the surface of a semiconductor substrate containing silicon; forming a sidewall insulating film on the sidewall of the gate electrode; forming a film of metal on the semiconductor substrate to cover the gate electrode and the sidewall insulating film; and heating the front and back sides of the semiconductor substrate through heat conduction by an ambient gas to cause the metal film to react with silicon contained in the semiconductor substrate and the gate electrode to thereby transform the metal film into a metal silicide film.

According to another aspect of the invention, there is provided a method of manufacture of a semiconductor device comprising the steps of: forming a gate electrode containing silicon above the surface of a semiconductor substrate containing silicon; forming a sidewall insulating film on the sidewall of the gate electrode; depositing a film of metal on the semiconductor substrate to cover the gate electrode and the sidewall insulating film; forming a first metal silicide film on portions where the metal is in contact with the semiconductor substrate and a portion where the metal is in contact with the gate electrode by causing the metal to react with silicon contained in the semiconductor substrate and the gate electrode, the first metal silicide film being such that the content ratio of the metal to silicon is larger than 1 but not larger than 2; removing unreacted metal; and transforming the first metal silicide film into a second metal silicide film by causing the first metal silicide film to react with silicon contained in the semiconductor substrate and the gate electrode, the second metal silicide film being such that the content ratio of the metal to silicon is smaller than that in the first metal silicide film.

According to still another aspect of the invention, there is provided a semiconductor device comprising: a semiconductor device containing silicon; source and drain regions formed in the semiconductor substrate; a gate electrode formed above a portion of the semiconductor substrate between the source and drain regions; a sidewall insulating film formed on the sidewall of the gate electrode; and a metal silicide film containing nickel and silicon and formed on the top of the gate electrode and the surface of the source and drain regions, the metal silicide film being such that the full width at half maximum of the X-ray diffraction peak assigned to its (111) plane is 2 to 3°.

DETAILED DESCRIPTION OF THE INVENTION

An embodiment of the present invention will be described hereinafter with reference to the accompanying drawings. In the drawings, identical or similar parts are denoted by like or similar reference characters. It should be noted that the drawings are illustrated schematically, and the relationship between thickness and plane dimensions and the ratios in thickness among films differ from actual ones. Thus, specific thicknesses and dimensions should be judged in consideration of the following description. The drawings may contain parts which differ in the relationship or ratio among dimensions.

Figure 1:
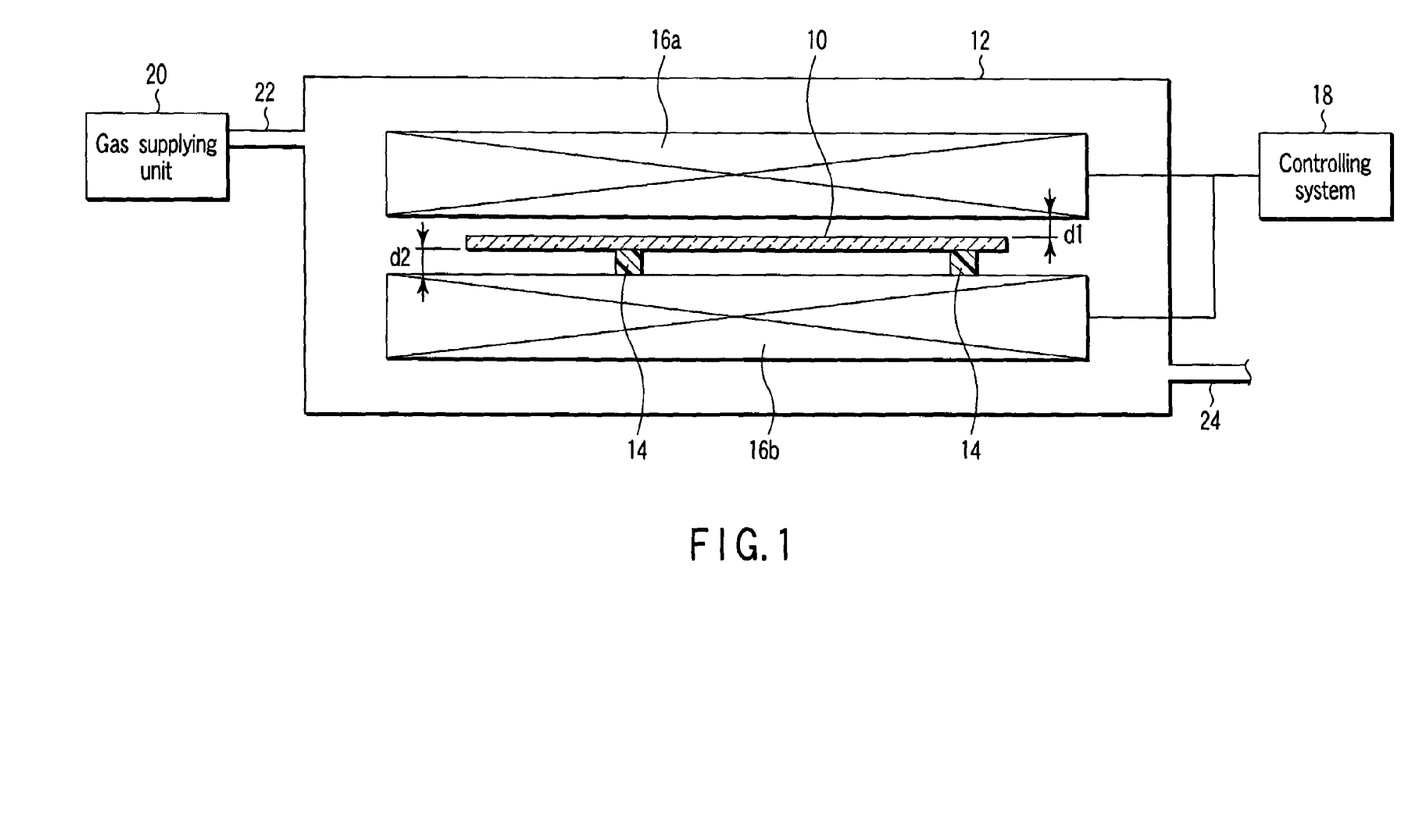
FIG. 1 is a schematic illustration of thermal processing apparatus according to an embodiment of the invention.

A thermal processing system for forming metal silicides in accordance with the embodiment of the invention includes a process chamber 12, a control system 18, and a gas supply unit 20. The process chamber 12 is equipped with a gas introducing pipe 22 connected with the gas supply unit 20 and a gas exhaust pipe 24. In the process chamber 12, heaters 16a and 16b are placed to face each other. A semiconductor substrate 10 supported by supports 14 is placed between the heaters 16a and 16b. The heaters 16a and 16b each have a size sufficiently larger than the diameter of the semiconductor substrate 10. The heaters 16a and 16b are connected with the control system 18 adapted to control a heating process.

At the time of silicidation of the semiconductor substrate 10 of silicon (Si), an ambient gas, such as hydrogen ($H_2$), nitrogen ($N_2$) or argon (Ar), is introduced from the gas supply unit 20 via the gas introducing pipe 22 into the process chamber 12. The semiconductor substrate 10 is heated as the result of heat generated by the heaters 16a and 16b being conducted to its front and back sides via the ambient gas. The ambient gas introduced into the process chamber 12 is discharged through the exhaust pipe 24.

For instance, with the current silicidation based on furnace heating, in order to form a uniform metal silicide in the surface of a semiconductor substrate under heat uniformity, it is required to lower the temperature elevation rate below 1° C./s. This makes it impossible to carry out the heating process in a short time. For this reason, it is difficult to suppress an increase in the thickness of a film of metal silicide to be formed. In addition, it is also difficult to suppress the diffusion of metal used to form the metal silicide.

The RTA-based silicidation allows the surface region of the semiconductor substrate 10 to be heated in a short time. The semiconductor substrate 10 is rapidly heated by absorbing light from a halogen lamp. On the other hand, it is difficult to heat insulating films which do not absorb the halogen lamp light. In surrounding regions of the insulating films, local heating occurs due to halogen lamp light outputted from the inside of the insulating films with refraction. For this reason, it is difficult to heat the semiconductor substrate 10 uniformly. In addition, with RTA, a metal, such as Ni, on insulating films will aggregate at a temperature of 400° C. or higher.

The temperature elevation rate of the heaters 16a and 16b according to this embodiment, while being relatively high, is lower than that of a halogen lamp for RTA but higher than that of an electric furnace for normal furnace heating. For example, the temperature elevation rate lies in the range of about 1 to about 10° C./s. The distance, d1, between the heater 16a and the front side of the semiconductor substrate 10 which are opposed to each other and the distance, d2, between the heater 16b and the back side of the semiconductor substrate 10 are both in the range of about 5 to about 15 mm and preferably in the range of about 8 to about 10 mm. Setting the distances d1 and d2 in the range of about 5 to about 15 mm allows the temperature of the semiconductor substrate 10 to rise uniformly under almost thermal equilibrium conditions through thermal conduction by the ambient gas. Since the semiconductor substrate 10 is heated at a relatively high temperature elevation rate under thermal equilibrium conditions, the aggregation of a metal, such as Ni, on insulating films can be prevented even in the temperature range of about 400 to 550° C.

The method of manufacture of a semiconductor device according to the embodiment of the invention will be described by way of an example of manufacturing an n-channel MOSFET (nMOSFET). The semiconductor device is not limited to an nMOSFET. The principles of the invention are applicable to a pMOSFET, complementary MOSFETs (CMOSFETs), a metal insulator semiconductor (MIS) FET using a film of silicon nitride. ($Si_3N_4$) or silicon oxy-nitride (SiON) as the gate insulating film, or a MISFET using composite insulating films of $SiO_2$, SiON, $Si_3N_4$, and metal oxide as its gate insulating film.

Figure 2:
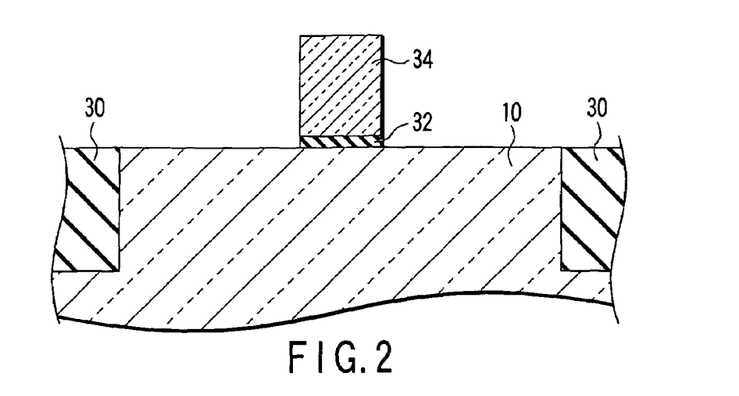
FIGS. 2 through 7 are sectional views, in the order of steps of manufacture, of a semiconductor device according to the embodiment of the invention.

(A) As shown in FIG. 2, a p-type Si semiconductor substrate 10 is formed on top with trenches by using photolithographic and reactive ion etching (RIE) techniques. Next, an insulating film, such as $SiO_2$, is deposited over the surface of the semiconductor substrate 10 by using chemical vapor deposition (CVD) to fill the trenches. The insulating film deposited on the surface of the semiconductor substrate 10 is then removed by using chemical mechanical polishing (CMP) to form device isolation regions 30. Next, using thermal oxidation, an insulating film is formed on the surface of a region of the semiconductor substrate (the surface of a device region) between the trenches 30. Then, a polysilicon film is deposited onto the insulating film by means of CVD. Next, the polysilicon film and the insulating film are selectively removed by means of photolithographic and RIE techniques to thereby form a gate insulating film 32 and a gate electrode 34.

Figure 3:
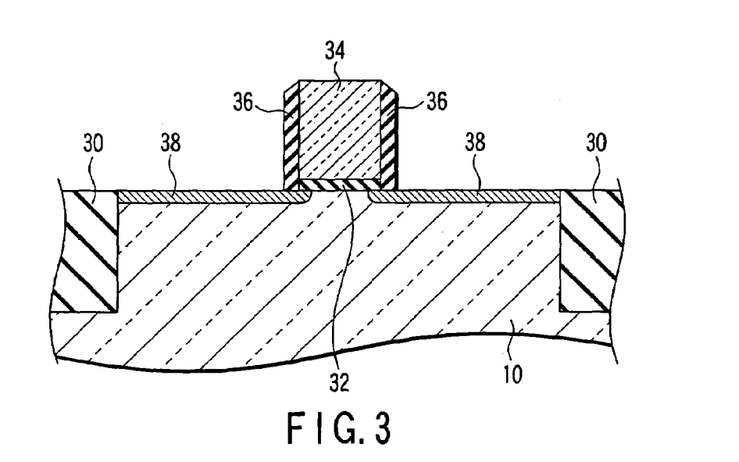

(B) As shown in FIG. 3, an insulating film, such as $Si_3N_4$, is deposited at a thickness in the range of about 2 to about 10 nm over the surface of the semiconductor substrate 10 by means of CVD. Next, the deposited insulating film is selectively removed by using anisotropic etching such as RIE to form an offset spacer 36 on the sidewall of the gate electrode 34 and the gate insulating film 32. Next, using the gate electrode 34, the offset spacer 36 and the device isolation regions 30 as a mask, impurity ions, such as arsenic (As), are implanted into the semiconductor substrate 10 to form impurity implanted regions on the opposite sides of the gate insulating film 32. Next, a heating process is carried out by using RTA to activate the implanted impurity ions. By this heating process, the implanted impurity ions are electrically activated while they are diffusing to form n-type extension regions 38 in the proximity of both ends of the gate insulating film 32 and in the source/drain regions between the device isolation regions 30.

Figure 4:
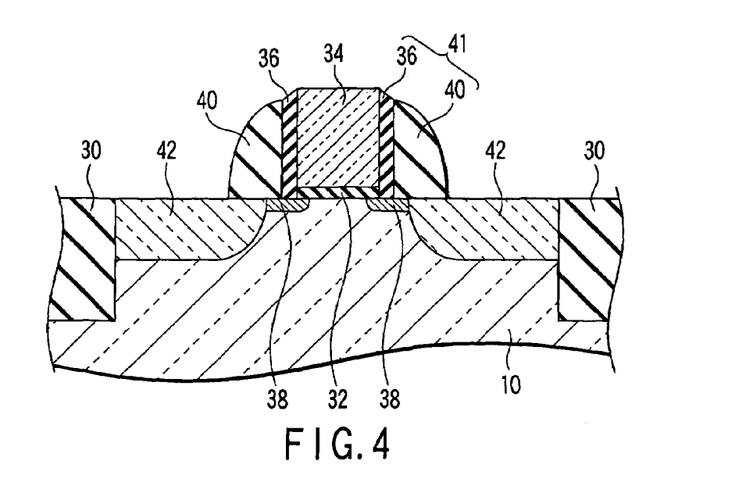

(C) As shown in FIG. 4, using CVD, an insulating film, such as Si3N4, is deposited onto the semiconductor substrate 10 formed with the extension regions 38. Next, using anisotropic etching such as RIE, the deposited insulating film is selectively removed to form a sidewall spacer 40 on the sidewall of the offset spacer 36. Next, using the gate electrode 34, a sidewall insulating film comprised of the offset spacer 36 and the sidewall spacer 40, and the device isolation regions 30 as a mask, impurity ions, such as As or phosphorous (P), are implanted into the extension regions 38. Then, using RTA, n$^+$-type contact regions (impurity diffusion layers) 42 are formed in the regions below the sidewall spacers 40 and in the source/drain regions between the device isolation regions 30 more deeply than the extension regions 38. At the same time, the impurity ions implanted into the gate electrode 34 are activated and consequently the conductivity type of the gate electrode becomes n type.

Figure 5:
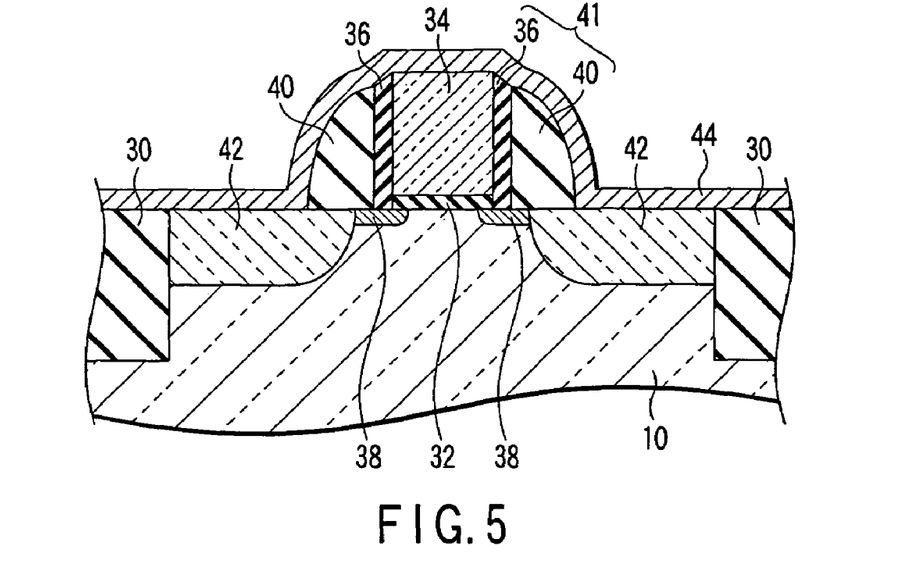

(D) As shown in FIG. 5, using sputtering, a film 44 of metal, such as Ni, is deposited over the surface of the semiconductor substrate 10 so as to cover the gate electrode 34, the sidewall insulating film 41, and the device isolation regions 30. The metal film 44 is deposited at a thickness of about 10 nm while the semiconductor substrate 10 is heated at a temperature in the range of about 150 to about 300° C., preferably at about 200° C.

Figure 6:
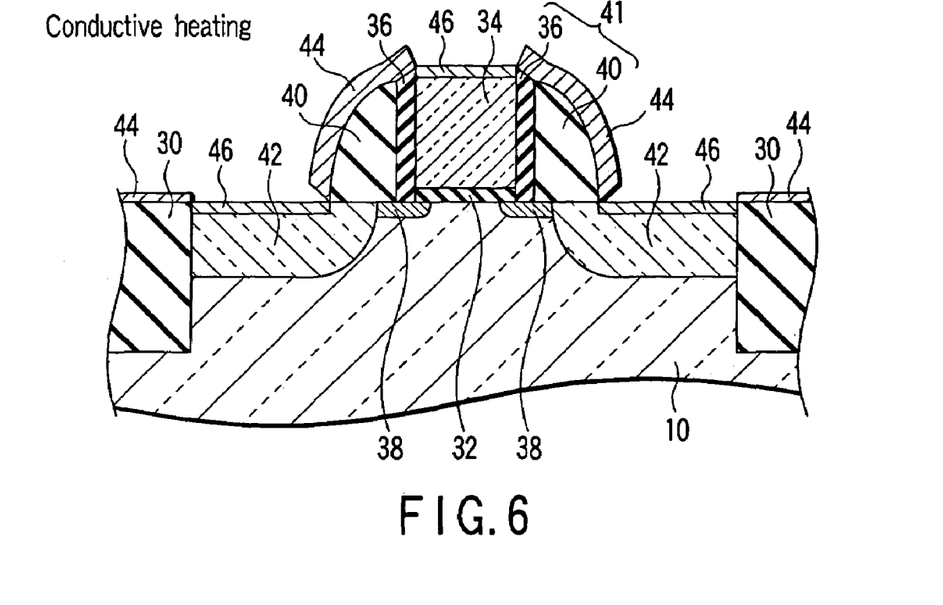

(E) The semiconductor substrate 10 is placed on the supports 14 in the process chamber 12 of the thermal processing apparatus shown in FIG. 2 and then an ambient gas is introduced into the chamber. Heat is generated by the heaters 16a and 16b under the control of the control system 18. The front and back sides of the semiconductor substrate 10 are heated to a temperature in the range of about 200 to about 400° C., preferably in the range of about 250 to about 350° C., through thermal conduction with the ambient gas as a medium. The thermal processing time is in the range of about 3 to about 15 min, preferably in the range of about 5 to about 10 min, and more preferably in the range of about 5 to about 8 min. The semiconductor substrate 10 is taken out of the process chamber 12 immediately after the termination of the heating process. As a result, as shown in FIG. 6, the metal film 44 deposited on the surface of the gate electrode 34 and the contact regions 32 reacts with Si to form a first metal silicide film 46, such as Ni$_x$Si ($1<x\leq2$), in which the content ratio of the metal to Si is larger than 1.

Figure 7:
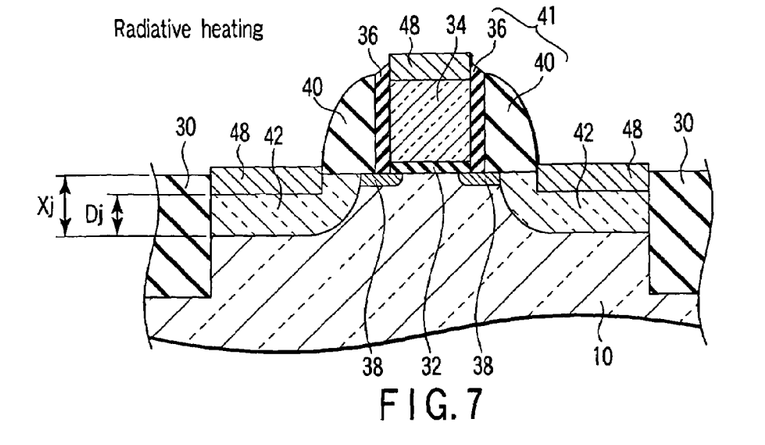

(F) As shown in FIG. 7, the unreacted metal film 44 is selectively removed by means of wet etching using sulfulic acid ($H_2SO_4$) or ammonium hydroxide ($NH_4OH$), and hydrogen peroxide ($H_2O_2$). Using RTA, the semiconductor substrate 10 is heated at a temperature in the range of about 400 to about 550° C., and preferably in the range of about 450 to about 500° C. to form a second metal silicide film 48, such as NiSi, in which the content ratio of the metal to Si is nearly 1.

(G) After that, an interlayer insulating film, such as $SiO_2$, is deposited onto the semiconductor substrate 10 by means of CVD. Next, contact holes are formed in the interlayer insulating film to reach the second metal silicide film 48 by using photolithographic and RIE techniques. Next, interconnect lines are connected via the contact holes to the second metal silicide film 48 formed on the contact regions 42 and the gate electrode 34. Thus, a semiconductor device is manufactured.

In the semiconductor device thus manufactured, as shown in FIG. 7, a pn junctions is formed at the boundary between each of the contact regions 42 and the semiconductor substrate 10 at the depth of xj from the substrate surface. When the depth xj decreases as the dimensions of devices are scaled down, the distance Dj from the bottom of the second metal silicide film 48 to the pn junction decreases. If, therefore, the distance Dj were nonuniform in the source/drain regions, the risk of occurrence of junction leakage would increase.

In the embodiment, the front and back sides of the semiconductor substrate 10 are each heated through heat conduction by the ambient gas. Therefore, dissimilar materials, such as the device isolation regions 30 formed in the semiconductor substrate 10 and the sidewall insulating film 41, are heated uniformly together with the semiconductor substrate 10 and the gate electrode 34 under balanced conditions. The metal film 44 deposited on the gate electrode 34 and the contact regions 42 reacts uniformly with Si. As a result, the distance Dj from the bottom of the second metal silicide film 48 to the pn junction can be made substantially uniform in the source/drain regions.

Figure 8:
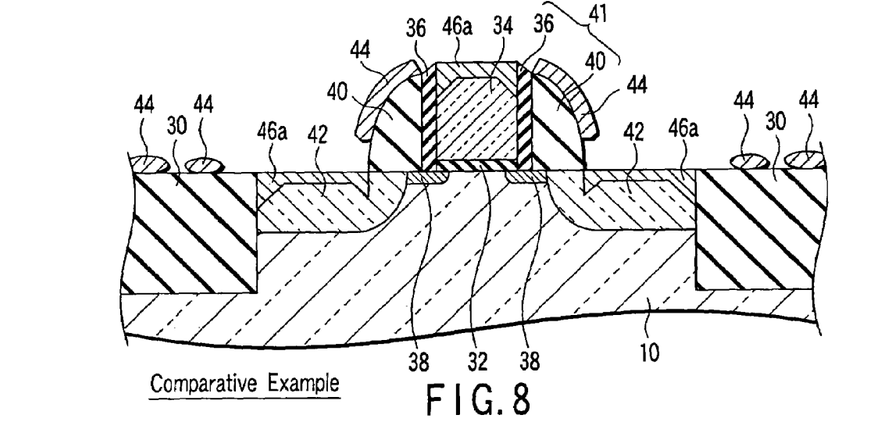
FIGS. 8 and 9 are sectional views, in the order of steps of manufacture, of a semiconductor device according to a comparative example.

As a comparative example is shown an example of forming a first metal silicide film by performing normal RTA using a halogen lamp for 90 sec at about 300° C., then removing the unreacted metal film, and performing a heating process at about 500° C. to thereby form a second metal silicide. In the heating process of forming the first metal silicide film 46a through RTA, it is known that the metal film 44 deposited on the device isolation regions 30 and the sidewall insulating film 41 aggregates as shown in FIG. 8. Upon aggregation, part of the metal film 44 on the device isolation regions 30 and the sidewall insulating film 41 flows into the contact regions 42 and the gate electrode 34. As a result, the thicknesses at the edges of the first silicide film 46a increase.

Figure 9:
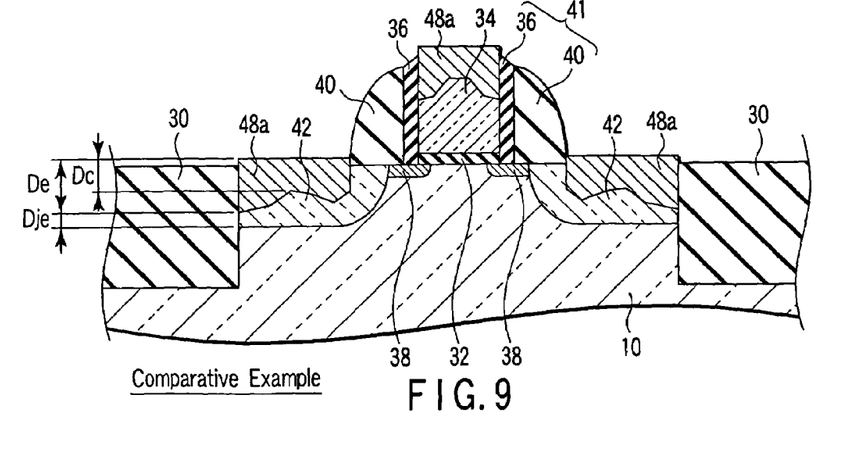

Furthermore, by the heating process of forming the second metal silicide film 48a, its thickness De at its edges where the contact regions 42 and the gate electrode 34 are in contact with the device isolation regions 30 and the sidewall insulating film 41, respectively, is made larger than thickness Dc in its central portion as shown in FIG. 9. As a result, the junction leakage becomes easy to occur.

Figure 10:
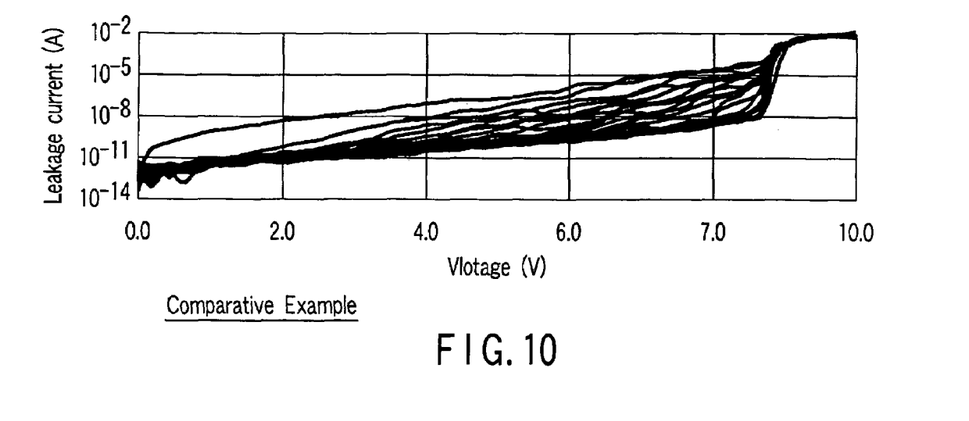
FIG. 10 shows pn junction leakage currents in the semiconductor device according to the comparative example.
Figure 11:
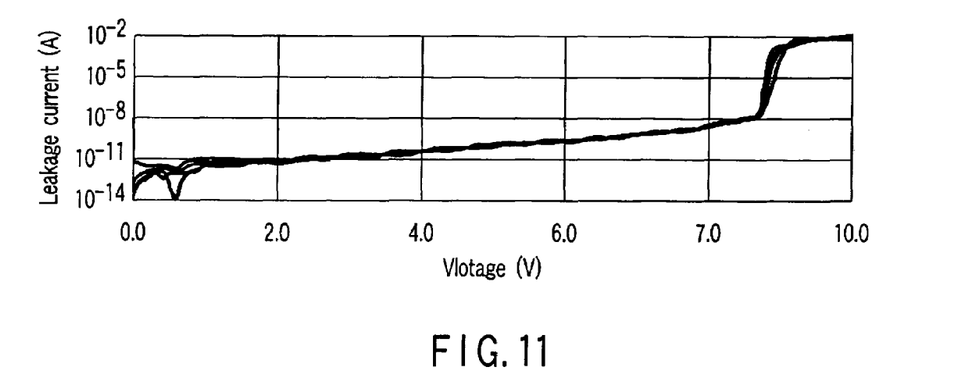
FIG. 11 shows pn junction leakage currents in the semiconductor device according to the embodiment of the invention.

As shown in FIGS. 10 and 11, the comparative example of an nMOSFET shows large variations in leakage current in the n$^+$p junctions between the contact regions 42 and the semiconductor substrate 10. In the embodiment, the leakage current is reduced and moreover its variations are suppressed in comparison with the comparative example.

Figure 12:
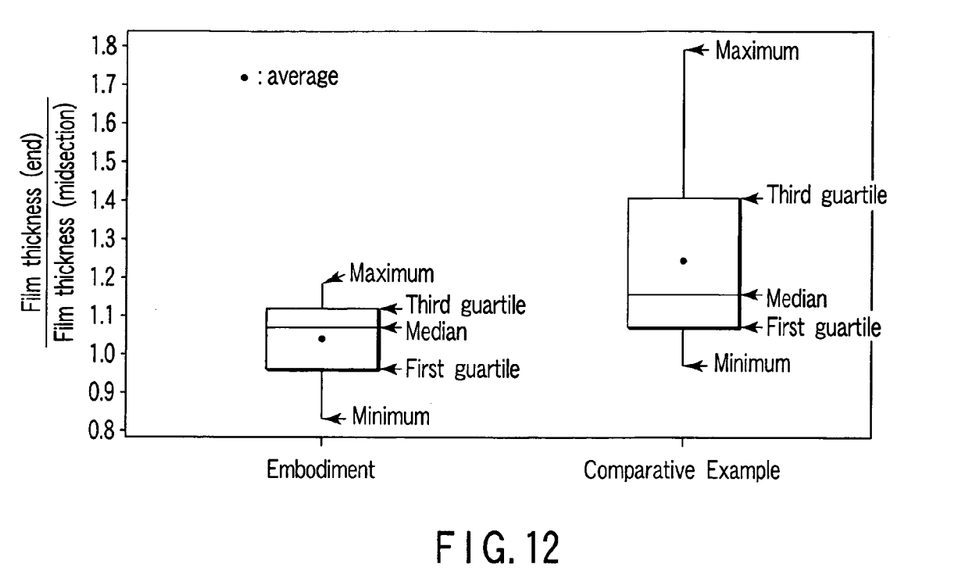
FIG. 12 is a diagram (boxplot) illustrating distributions of ratios of the thickness at the central portion of the metal silicide film to that at its edge in the embodiment and the comparative example.

As shown in FIG. 12, the average of the ratio of De to Dc is about 1.25 in the comparative example and about 1.05 in the embodiment. Moreover, the comparative example is larger than the embodiment in each of the maximum, third quartile, median, first quartile, and minimum. It can therefore been seen that, in the comparative example, the thickness of the second metal silicide film at its edges increases and shows large variations in comparison with the embodiment. Thus, the embodiment can suppress an increase in the thickness of the second metal silicide film at its edges.

Figure 13:
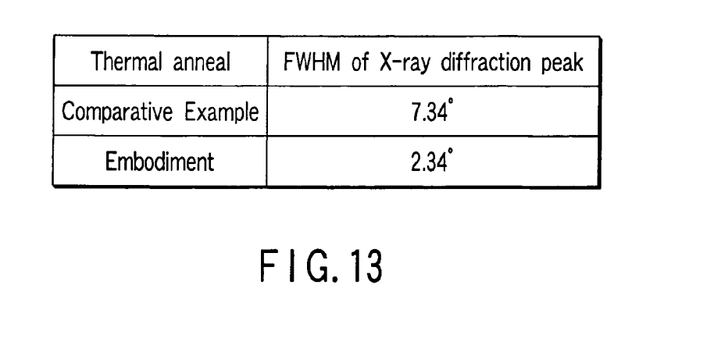
FIG. 13 shows the orientation property of the metal silicide film in the embodiment of the invention.

As shown in FIG. 13, the orientation property of NiSi film as the second metal silicide film formed is evaluated using X-ray diffraction (XRD). FIG. 13 shows the half-width of the X-ray diffraction peak assigned to the (111) plane of the NiSi film. The full-width at half maximum (FWHM) of the X-ray diffraction peak assigned to the (111) plane of the NiSi film formed in accordance with the embodiment is small in comparison with the comparative example. That is, the embodiment can form an NiSi film that is high in orientation property. In the embodiment, the full-width at half maximum is 2.34°. According to the embodiment, a second metal silicide film (an NiSi film in this embodiment) can be obtained in which the full-width at half maximum of the X-ray diffraction peak assigned to the (111) plane of NiSi is 1.5 to 3° and hence the orientation property is high. If the orientation property of the second metal silicide film 48 is high, the morphology of its bottom can be made uniform. As a result, the occurrence of junction leakage can be suppressed.

In the XRD according to the embodiment, an experiment is made with the following condition.

(X-ray source)
Power: 45 kV-360 mA
Rated power: 18 kW
Target: Cu
(Measurement)

The Chi orientation intensity distribution of the NiSi (111) diffraction intensity is measured.

With the embodiment, it becomes possible to suppress increasing of the thickness of the second metal silicide film 48 formed on the gate electrode 34 at its edges and make the morphology of its bottom uniform. As a result, it becomes possible to suppress degradation of the reliability of the gate insulating film due to diffusion of metal atoms from the first and second metal silicide films 46 and 48.

According to the semiconductor device manufacturing method of this embodiment, the occurrence of a failure of junction leakage can be suppressed in forming a film of metal silicide on a shallow impurity diffusion layer in a self-aligned manner, allowing the semiconductor device manufacturing yield to be improved.

With the embodiment, the first metal silicide film 46 of $Ni_xSi$ is formed through a heating process at a low temperature in the range of about 200 to about 400° C. and then the second metal silicide film of NiSi is formed through a heating process at a high temperature in the range of about 400 to about 550° C. In comparison with metal silicide films formed only through a high-temperature heating process without using a low-temperature heating process, the first and second metal silicide films 46 and 48 can be made small in grain size. From the point of view of microstructuring of devices, it is important to suppress an increase in the grain size of metal silicide and form the metal silicide-Si interface smoothly.

In the silicidation of the first metal silicide film 46, if the temperature is below 200° C., the reaction of metal with Si little proceeds, failing to form the first metal silicide film. Thus, an increase in the grain size of metal silicide cannot be suppressed. If the temperature of silicidation exceeds 400° C., the grain size of the crystallized first metal silicide film will increase.

In the silicidation of the second metal silicide film 48, if the temperature is 400° C. or less, the rate of reaction of $Ni_xSi$ with Si is low, resulting in the formation of an insufficient NiSi film. At temperatures in excess of 550° C., the reaction of NixSi with Si proceeds too much, resulting in the formation of a film of $NiSi_2$. In comparison with the NiSi film, the NixSi film and the $NiSi_2$ film are high in resistivity. It is therefore not desirable from the point of view of reduction of parasitic resistance of the source/drain regions and the gate electrode 34.

Upon formation of the first metal silicide film 46, the heating process is carried out for about 3 to about 15 min. When the heating process time is less than 3 min, the silicidation becomes nonuniform, degrading the morphology of the interface between metal silicide and Si. When the heating process time is more than 15 min, the diffusion of metal from the metal silicide film occurs remarkably.

The metal film 44 is deposited while the semiconductor substrate 10 is heated at a temperature in the range of about 150 to about 300° C. When the deposition temperature is lower than 150° C., amorphous metal silicide is mainly produced in the interface between the deposited metal film 44 and the contact region 42 or the gate electrode 34. However, since crystallized metal silicide is produced in part of the interface, the morphology of the bottom of the first metal silicide film 46 formed through heating process is degraded. When the deposition temperature exceeds 300° C., the aggregation of the metal layer 44 deposited on the device isolation regions 30 and the sidewall insulating film 41 takes place, making it difficult to make the thickness of the metal film 44 uniform.

[Modification]

A method of manufacturing a semiconductor device according to a modification of the invention will be described with reference to FIGS. 14, 15, and 16. The semiconductor device is an nMOSFET. The processes described with reference to FIGS. 2, 3, and 4 are applied to the manufacture of this semiconductor device, and repeated descriptions are omitted.

Figure 14:
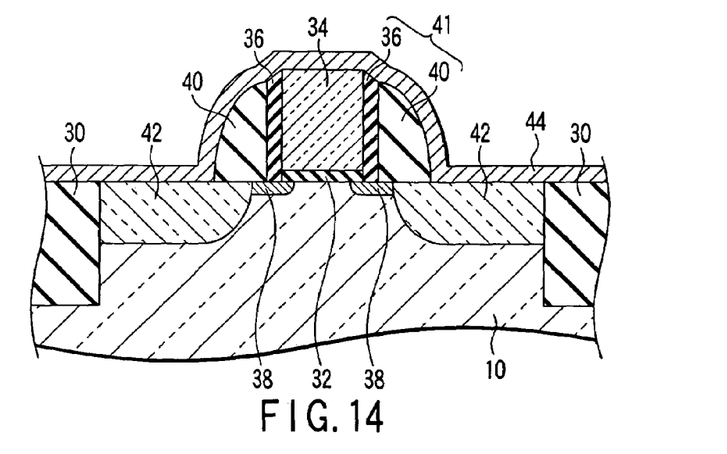
FIGS. 14, 15, and 16 are sectional views, in the order of steps of manufacture, of a semiconductor device according to a modification of the invention.
Figure 15:
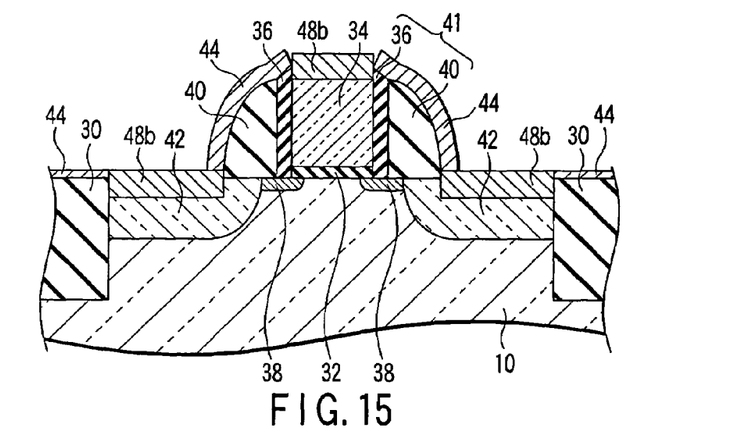

(A) As shown in FIG. 14, a film 44 of metal, such as Ni, is deposited over the surface of the semiconductor substrate 10 to cover the gate electrode 34, the sidewall insulating film 41, and the device isolation regions 30 by means of sputtering. The metal film 44 is deposited at a thickness of about 10 nm while the semiconductor substrate 10 is heated at a temperature of about 200° C.

(B) The semiconductor substrate 10 is placed in the heating process chamber 12 of FIG. 1 into which the ambient gas is introduced. Heat is generated by the heaters 16a and 16b under the control of the control system 18. The front and back sides of the semiconductor substrate 10 are each heated at a temperature in the range of about 450 to about 500° C. through thermal conduction by the ambient gas. The heating process time is in the range of about 3 to about 15 min, preferably in the range of about 5 to 10 min, and more preferably in the range of about 5 to about 8 min. The semiconductor substrate 10 is taken out of the process chamber 12 immediately after the termination of the heating process. As a result, as shown in FIG. 15, the deposited metal film 44 on the gate electrode 34 and the contact regions 42 reacts with Si to form a metal silicide film 48b, such as NiSi, in which the content ration of metal to Si is nearly 1.

Figure 16:
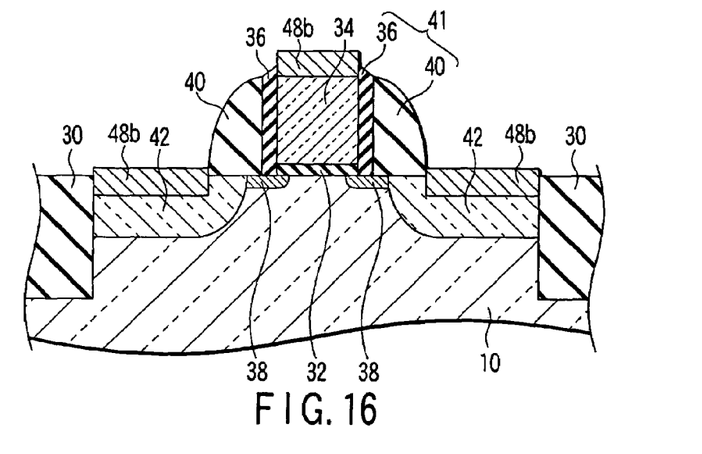

(C) As shown in FIG. 16, the unreacted metal film 44 is selectively removed by wet etching using $H_2SO_4$ or $NH_4OH$ and $H_2O_2$. After that, contact holes are formed in an interlayer insulating film, such as $SiO_2$, deposited above the semiconductor substrate 10. Interconnect lines are connected to the metal silicide film 48b formed on the contact regions 42 and the gate electrode 34 via the contact holes. Thus, a semiconductor device is manufactured.

In the modification, the front and back sides of the semiconductor substrate 10 are each heated through heat conduction by the ambient gas. Therefore, dissimilar materials, such as the device isolation regions 30 formed in the semiconductor substrate 10 and the sidewall insulating film 41, are heated uniformly together with the semiconductor substrate 10 and the gate electrode 34 under balanced conditions. The metal film 44 deposited on the gate electrode 34 and the contact regions 42 reacts uniformly with Si. As a result, the distance Dj from the bottom of the second metal silicide film 48 to the pn junction can be made substantially uniform in the source/drain regions.

Upon formation of the metal silicide film 48b, the heating process is carried out for about 3 to about 15 min. When the heating process time is less than 3 min, the silicidation becomes nonuniform, degrading the morphology of the interface between metal silicide and Si. When the heating process time is more than 15 min, the diffusion of metal from the metal silicide film occurs remarkably.

According to the semiconductor device manufacturing method of this modification, the occurrence of a failure of junction leakage can be suppressed in forming a film of metal silicide on a shallow impurity diffusion layer in a self-aligned manner, allowing the semiconductor device manufacturing yield to be improved.

[Other Modifications]

Although the preferred embodiments of the invention have been disclosed and described, it is to be understood that the invention is not limited to the disclosed embodiments and it is apparent that other embodiments and various modifications are possible.

In the embodiment of the invention, the diffusion of metal atoms that form a metal silicide can be suppressed by ion implanting fluorine (F) into the contact regions 42 and the gate electrode 34. For example, after the contact regions 42 have been formed as shown in FIG. 4, fluorine is ion implanted into the contact regions 42 and the gate electrode 34 with the device isolation regions 30 and the sidewall insulating film 41 as a mask. Fluorine is implanted at a dose of about $1 \times 10^{14}$ cm$^{-2}$ to about $1 \times 10^{15}$ cm$^{-2}$, preferably at a dose of about $3 \times 10^{14}$ cm$^{-2}$. It is desirable that the depth of implantation of fluorine be within the contact regions 42.

In the embodiments, Ni is used as a metal to form silicide. However, this is not restrictive. For example, it is possible to use a transition metal, such as titanium (Ti), platinum (Pt), ytterbium (Yb), yttrium (Y), erbium (Er), palladium (Pd), etc., or an alloy of transition metal with Ni as its major constituent.

In the embodiments, polysilicon is used as the gate electrode 34. Alternatively, amorphous silicon may be used. However, the gate electrode material is not limited to silicon. A material, such as silicon germanium (SiGe), which contains silicon may be used.

Thus, the invention covers various embodiments and modifications which are not described herein. Therefore, the scope of the invent-ion should be defined only by the appended claims.

According to the invention, as described above, a semiconductor device manufacturing method can be provided which can suppress an increase in the thickness of a metal silicide film and the occurrence of a failure of junction leakage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacture of a semiconductor device comprising the steps of:
    forming a gate electrode containing silicon above the surface of a semiconductor substrate containing silicon;
    forming a sidewall insulating film on the sidewall of the gate electrode;
    forming a film of metal on the semiconductor substrate to cover the gate electrode and the sidewall insulating film; and
    heating the front and back sides of the semiconductor substrate through heat conduction by an ambient gas to cause the metal film to react with silicon contained in the semiconductor substrate and the gate electrode to thereby transform the metal film into a metal silicide film.

2. The method according to claim 1, wherein the metal is nickel.

3. The method according to claim 2, wherein the semiconductor substrate is heated at a temperature in the range of 200 to 550° C.

4. The method according to claim 2, wherein the semiconductor substrate is heated at a temperature in the range of 200 to 400° C.

5. The method according to claim 4, further comprising removing the unreacted metal film on the sidewall insulating film after the formation of the metal silicide film, and heating the semiconductor substrate at a temperature which is higher than the temperature to form the metal silicide film but not higher than 550° C.

6. A method of manufacture of a semiconductor device comprising the steps of:
    forming a gate electrode containing silicon above the surface of a semiconductor substrate containing silicon;
    forming a sidewall insulating film on the sidewall of the gate electrode;
    depositing a film of metal on the semiconductor substrate to cover the gate electrode and the sidewall insulating film;
    forming a first metal silicide film on portions where the metal is in contact with the semiconductor substrate and a portion where the metal is in contact with the gate electrode by causing the metal to react with silicon contained in the semiconductor substrate and the gate electrode, the first metal silicide film being such that the content ratio of the metal to silicon is larger than 1 but not larger than 2;
    removing unreacted metal; and
    transforming the first metal silicide film into a second metal silicide film by causing the first metal silicide film to react with silicon contained in the semiconductor substrate and the gate electrode, the second metal silicide film being such that the content ratio of the metal to silicon is smaller than that in the first metal silicide film,
    wherein heat conduction is carried out through an ambient gas which surrounds the semiconductor substrate deposited with the metal.

7. The method according to claim 6, wherein the first metal silicide film is formed by heating the semiconductor substrate through the heat conduction, and the second metal silicide film is formed by heating the semiconductor substrate formed with the first metal silicide film through radiation.

8. The method according to claim 7, wherein the conduction heating is carried out at a temperature in the range of 200 to 400° C., and the radiation heating is performed at a temperature in the range of 400 to 550° C.

9. The method according to claim 6, wherein the metal is a transition metal.

10. The method according to claim 9, wherein the transition metal is nickel (Ni), titanium (Ti), platinum (Pt), ytterbium (Yb), yttrium (Y), erbium (Er), or palladium (Pd).

11. The method according to claim 6, wherein the metal is an alloy of transition metal having nickel as its major constituent.

12. The method according to claim 6, wherein, when the second silicide film is NiSi, the full width at half maximum of the X-ray diffraction peak assigned to the (111) plane of NiSi is 2 to 3°.

13. The method according to claim 6, wherein the metal is deposited at a temperature in the range of 150 to 300° C.

14. The method according to claim 6, wherein fluorine is introduced into the semiconductor substrate and the gate electrode before the metal is deposited.

15. A semiconductor device comprising:
a semiconductor device containing silicon;
source and drain regions formed in the semiconductor substrate;
a gate electrode formed above a portion of the semiconductor substrate between the source and drain regions;
a sidewall insulating film formed on the sidewall of the gate electrode; and
a metal silicide film containing nickel and silicon and formed on the top of the gate electrode and the surface of the source and drain regions, the metal silicide film being such that the full width at half maximum of the X-ray diffraction peak assigned to its (111) plane is 1.5 to 3°.

* * * * *